United States Patent
Shi et al.

(10) Patent No.: US 10,032,644 B2
(45) Date of Patent: Jul. 24, 2018

(54) BARRIER CHEMICAL MECHANICAL PLANARIZATION SLURRIES USING CERIA-COATED SILICA ABRASIVES

(71) Applicant: Air Products and Chemicals, Inc., Allentown, PA (US)

(72) Inventors: Xiaobo Shi, Chandler, AZ (US); James Allen Schlueter, Phoenix, AZ (US); Mark Leonard O'Neill, Queen Creek, AZ (US); Dnyanesh Chandrakant Tamboli, Gilbert, AZ (US)

(73) Assignee: VERSUM MATERIALS US, LLC, Tempe, AZ (US)

( * ) Notice: Subject to any disclaimer, the term of this patent is extended or adjusted under 35 U.S.C. 154(b) by 0 days.

(21) Appl. No.: 15/166,605

(22) Filed: May 27, 2016

(65) Prior Publication Data
US 2016/0358790 A1    Dec. 8, 2016

Related U.S. Application Data

(60) Provisional application No. 62/171,360, filed on Jun. 5, 2015.

(51) Int. Cl.
| | |
|---|---|
| *C09K 13/02* | (2006.01) |
| *H01L 21/321* | (2006.01) |
| *C09G 1/02* | (2006.01) |
| *H01L 21/67* | (2006.01) |
| *C09K 3/14* | (2006.01) |
| *H01L 21/3105* | (2006.01) |

(52) U.S. Cl.
CPC .......... *H01L 21/3212* (2013.01); *C09G 1/02* (2013.01); *C09K 3/1463* (2013.01); *H01L 21/31053* (2013.01); *H01L 21/67075* (2013.01); *H01L 21/67092* (2013.01)

(58) Field of Classification Search
USPC .......................................... 438/693; 252/79.5
See application file for complete search history.

(56) References Cited

U.S. PATENT DOCUMENTS

| | | | |
|---|---|---|---|
| 2004/0152309 A1* | 8/2004 | Carter | ..................... C03C 19/00 438/689 |
| 2009/0087988 A1 | 4/2009 | Sale | |
| 2012/0077419 A1* | 3/2012 | Zhang | ................. C09K 3/1436 451/36 |
| 2014/0051250 A1 | 2/2014 | Minami et al. | |

FOREIGN PATENT DOCUMENTS

| | | |
|---|---|---|
| CN | 101591509 A | 12/2009 |
| CN | 102559061 A | 7/2012 |
| CN | 103666372 A | 3/2014 |
| EP | 2 592 122 A1 | 5/2013 |
| EP | 2779217 A2 | 9/2014 |
| EP | 2818526 A1 | 12/2014 |
| EP | 2865727 A1 | 4/2015 |
| WO | 2007056002 A1 | 5/2007 |

\* cited by examiner

*Primary Examiner* — Roberts Culbert
(74) *Attorney, Agent, or Firm* — Lina Yang (57) ABSTRACT

Chemical Mechanical Planarization (CMP) polishing compositions comprising composite particles, such as ceria coated silica particles, offer tunable polishing removal selectivity values between different films. Compositions enable high removal rates on interconnect metal and the silicon oxide dielectric while providing a polish stop on low-K dielectrics, a-Si and tungsten films. Chemical Mechanical Planarization (CMP) polishing compositions have shown excellent performance using soft polishing pad.

18 Claims, 2 Drawing Sheets

BARRIER CHEMICAL MECHANICAL PLANARIZATION SLURRIES USING CERIA-COATED SILICA ABRASIVES

CROSS REFERENCE TO RELATED PATENT APPLICATIONS

The present patent application claims the benefit of U.S. Provisional Patent Application Ser. No. 62/171,360 filed Jun. 5, 2015.

BACKGROUND OF THE INVENTION

The present invention relates to chemical mechanical planarization ("CMP") polishing compositions (CMP slurries, CMP composition or CMP formulations are used interchangeably) in the production of a semiconductor device, and polishing methods for carrying out chemical mechanical planarization. In particular, it relates to polishing compositions comprising composite abrasive particles that are suitably used for polishing patterned semiconductor wafers that composed of Cobalt (Co), SiN and oxide materials.

There are several CMP steps in integrated circuit (IC) manufacturing process, such as bulk metal layer, traditional Cu barrier layer polishing, most recently Co barrier layer polishing, shallow trench isolation (STI), inter-layer dielectric (ILD) CMP and gate poly CMP etc.

Typical polishing compositions for such applications contain: abrasive, corrosion inhibitor, and optionally other chemicals. Other chemicals could be included in barrier CMP polishing compositions to improve stability, booster removal rate, suppress removal rates, or inhibitors to provide metal film surface from corrosion during and post-CMP process.

Among common abrasives used in CMP slurries, such as silica, alumina, zirconia, titania and so on, ceria is known for its high reactivity toward silica oxide and is widely used in STI CMP composition for the highest oxide removal rate (RR) due to the high reactivity of ceria to silicon oxide. However ceria particles are also known to cause severe scratching, which would be even more problematic for polishing metallic films. Ceria particles are not typically used as abrasives for barrier CMP slurry compositions and with soft polish pad. So there is need to develop compositions on novel abrasive types for advanced applications.

As the semiconductor technology has advanced, there have been a lot of new challenges with the use of new film materials and complex integration schemes. For example, cobalt has been introduced as a both a barrier material for copper structure as well as an interconnect line material. There are a number of integration schemes in works that require varying selectivity between cobalt and other types of films. Certain applications require 1:1 polishing selectivity between Co and oxide dielectrics, some other applications may require additional polish stops on different films such as tungsten, amorphous silicon, polysilicon or low-K films. Certain applications may also require high removal rates of some underlying films such as titanium nitride or titanium. These challenging integration schemes requires novel slurry compositions to meet the CMP performance targets.

BRIEF SUMMARY OF THE INVENTION

Described herein are barrier CMP polishing compositions, methods and systems that satisfy the need.

In one aspect, described herein is a polishing composition comprising:

0.01 wt % to 20 wt % of abrasive selected from the group consisting of composite particles comprising core particles with surfaces covered by nanoparticles; abrasive particles selected from the group consisting of silica, alumina, zirconia, titania, ceria, surface modified inorganic oxide particles, and combinations thereof; and combinations thereof;

0.0001 wt % to 5 wt % of a pH-adjusting agent;

0.0005 wt % to 0.5 wt % of a corrosion inhibitor; and remaining being water;

wherein the core particles are selected from the group consisting of silica, alumina, titania, zirconia, polymer particle, and combinations thereof; and the nanoparticles are selected from the group consisting of zirconium, titanium, iron, manganese, zinc, cerium, yttrium, calcium, magnesium, lanthanum, strontium nanoparticle, and combinations thereof;

and the polishing composition has a pH of from about 2 to 11.

In another aspect, described herein is a polishing method for chemical mechanical planarization of a semiconductor device comprising at least one surface having a first material selected from the group consisting of metallic or alloy form of Co, Cu, Al, and combinations, and a second material, comprising the steps of:

a) contacting the at least one surface with a polishing pad;

b) delivering a polishing composition to the at least one surface, the polishing composition comprising:

0.01 wt % to 20 wt % of abrasive selected from the group consisting of composite particles comprising core particles with surfaces covered by nanoparticles; abrasive particles selected from the group consisting of silica, alumina, zirconia, titania, ceria, surface modified inorganic oxide particles, and combinations thereof; and combinations thereof;

0.0001 wt % to 5 wt % of a pH-adjusting agent;

0.0005 wt % to 0.5 wt % of a corrosion inhibitor; and the remaining being water;

wherein the core particles are selected from the group consisting of silica, alumina, titania, zirconia, polymer particle, and combinations thereof; and the nanoparticles are selected from the group consisting of zirconium, titanium, iron, manganese, zinc, cerium, yttrium, calcium, magnesium, lanthanum, strontium nanoparticle, and combinations thereof; and the polishing composition has a pH of from about 2 to 11;

and

C) polishing the at least one surface with the polishing composition.

In yet another aspect, described herein is a system for chemical mechanical planarization, comprising:

a semiconductor device comprising at least one surface having a first material selected from the group consisting of metallic or alloy form of Co, Cu, Al, and combinations, and a second material;

a polishing pad; and a polishing composition comprising:

0.01 wt % to 20 wt % of abrasive selected from the group consisting of composite particles comprising core particles with surfaces covered by nanoparticles; abrasive particles selected from the group consisting of silica, alumina, zirconia, titania, ceria, surface modified inorganic oxide particles, and combinations thereof; and combinations thereof;

0.0001 wt % to 5 wt % of a pH-adjusting agent;

0.0005 wt % to 0.5 wt % of a corrosion inhibitor; and
remaining being water;
wherein
the core particles are selected from the group consisting of silica, alumina, titania, zirconia, polymer particle, and combinations thereof; and the nanoparticles are selected from the group consisting of zirconium, titanium, iron, manganese, zinc, cerium, yttrium, calcium, magnesium, lanthanum, strontium nanoparticle, and combinations thereof; and
the polishing composition has a pH of from about 2 to 11;
and
wherein the at least one surface is in contact with the polishing pad and the polishing composition.

The polishing compositions can further comprises at least one of (1) 0.0010 wt % to about 1.0 wt % of dispersing additive selected form the group consisting of organic acid or its salt; polymeric acid or its salt; water soluble copolymer or its salt; copolymer or its salt containing at least two acid groups selected from the group consisting of carboxylic acid group, sulfonic acid group, and phosphonic acid group in the same molecule of a copolymer; polyvinyl acid or its salt, polyethylene oxide; polypropylene oxide; and combinations thereof;

(2) 0.001 wt % to 5 wt % of an oxidizer selected from the group consisting of periodic acid, periodate salt, perbromic acid, perbromate salt, perchloric acid, perchloric salt, perboric acid, and perborate salt, permanganate, bromate, chlorate, chromate, iodate, iodic acid, and combinations thereof;

(3) 0.001 wt % to 5 wt % of a chelating agent selected from the group consisting of organic acid or its salt; polymeric acid or its salt; water soluble copolymer or its salt; copolymer or its salt containing at least two acid groups selected from the group consisting of carboxylic acid group, sulfonic acid group, phosphoric acid, and pyridine acid in the same molecule of a copolymer; polyvinyl acid or its salt; inorganic potassium silicate; ammonium silicate; polyethylene oxide; polypropylene oxide; pyridine or its derivative; bipyridine or its derivative; bipyridine or its derivative; and combinations thereof; and (4) 0.0001 wt % to 10 wt % of a surfactant selected from the group consisting of a). non-ionic surface wetting agents; b). anionic surface wetting agents; c). cationic surface wetting agents; d). ampholytic surface wetting agents; and combinations thereof.

In one embodiment, the core particles are silica particles; the nanoparticles are ceria nanoparticles; and the composite particles are amorphous silica ceria particles having surfaces covered by single crystalline ceria nanoparticles; the abrasive particles are silica particles; the pH-adjusting agent is selected from the group consisting of sodium hydroxide, potassium hydroxide, ammonium hydroxide, quaternary organic ammonium hydroxide, and combinations thereof; and the corrosion inhibitor is selected from the group consisting of benzotriazole (BTA), imidazole, triazole, pyrazole, benzoimidazole, tetrazole, their relative derivatives, and combinations thereof.

In another embodiment, the polishing composition comprises ceria coated silica composite particles; a corrosion inhibitor selected form the group consisting of benzotriazole, imidazole, triazole, and combinations thereof; ammonium hydroxide or potassium hydroxide.

In yet another embodiment, the polishing composition comprises ceria coated silica composite particles; a corrosion inhibitor selected form the group consisting of benzotriazole, imidazole, triazole and combinations thereof; ammonium hydroxide or potassium hydroxide; and further comprises silica abrasive particles; potassium silicate or ammonium silicate; and a surfactant selected from the group consisting of acetylenic diol surfactant, alcohol ethoxylate surfactant and combination thereof.

In yet another embodiment, the polishing composition comprises ceria coated silica composite particles; a corrosion inhibitor selected form the group consisting of benzotriazole, imidazole, triazole and combinations thereof; ammonium hydroxide or potassium hydroxide; and further comprises silica abrasive particles; hydrogen peroxide; potassium silicate or ammonium silicate; and a surfactant selected from the group consisting of acetylenic diol surfactant, alcohol ethoxylate surfactant and combination thereof.

The polishing compositions may offer removal rate selectivity of 1.0:4.0 to 4.0:1.0 for $SiO_2$:Co; 1.0:1.0 to 6.0:1.0 or 10:1 to 15:1.0 for Co:SiN; and the polishing compositions have stop on polishing a-Si, OSG, SiOC, and W.

Compositions may also optionally comprise additives for preventing biological growth in the compositions.

In some embodiment, the polishing compositions of this invention are used to polish conducting metallic structures on a soft polishing pad.

DETAILED DESCRIPTION OF THE INVENTION

The ensuing detailed description provides preferred exemplary embodiments only, and is not intended to limit the scope, applicability, or configuration of the invention. Rather, the ensuing detailed description of the preferred exemplary embodiments will provide those skilled in the art with an enabling description for implementing the preferred exemplary embodiments of the invention. Various changes may be made in the function and arrangement of elements without departing from the spirit and scope of the invention, as set forth in the appended claims.

In the claims, letters may be used to identify claimed method steps (e.g. a, b, and c). These letters are used to aid in referring to the method steps and are not intended to indicate the order in which claimed steps are performed, unless and only to the extent that such order is specifically recited in the claims.

Compositions of this invention may be used for polishing one or many films on wafer surface patterned with conducting metal structures. In certain embodiments the conducting metal structures may be composed of, but not limited to cobalt, copper, or aluminum, in pure metallic or alloy forms.

Advanced technology uses a complex stack of films to form multi-layer device structure. Integration schemes require tuning of removal rate selectivity between various films to form the interconnect structure. Film stack may include dielectric materials such as but not limited to organo-silicate low-K films or polymeric low-K films or air-gap structures. Depending on the details of the interconnect fabrication scheme, additional dielectrics were needed to serve as either a diffusion barrier, capping layer, etch stop, hard mask, and/or polish stop. Typical dielectric films used may include but not limited to comprise silicon oxide films such those deposited from Tetraethyl Ortho Silicate (TEOS) precursors (referred to as TEOS films subsequently), high density plasma oxide films (HDP oxides), plasma enhanced chemically vapor deposited (PECVD) amorphous hydrogenated silicon nitride (a-SiN:H, carbon doped silicon nitrides (a-SiNC:H) with k values of 4.5-5.8, dense oxygen doped silicon carbides (a-SiCO:H) with k values of 4.0-4.8, and pure silicon carbides (a-SiC:H) with k values of 4.0-7.0. Films such as amorphous-Si (a-Si) and poly-Si may also be used as polish stop layers in certain applications. In certain applications, may involve simultaneous polishing of two interconnect materials such as cobalt and tungsten, requiring high selectivity of polish rates between the two. Multiple CMP steps are often used to form these interconnect structures and the selectivity requirements between different films is different between different steps. Compositions of these invention comprise some unique performance characteristics that enable various CMP applications at advanced technology nodes including but not limited to (1) Polish interconnect metal and dielectric film such as silicon oxide or silicon nitride with removal rate selectivity between the blanket interconnect film and the blanket dielectric film is between 0.1 and 5, or more preferably between 0.25 and 2 or most preferably between 0.5 and 1.5.

(2) Polish interconnect metal and low-K or LK (Organo Silicate Glass (OSG) or polymeric insulators) with removal rate selectivity the blanket interconnect film and the blanket low-K dielectric film is more than 10, or more preferably more than 50 or most preferably more than 100

(3) Polish interconnect metal and silicon oxide or silicon nitride dielectric with removal rate selectivity the blanket interconnect film and the blanket dielectric film is between 0.1 to 5, or preferably between 0.25 and 2 or most preferably between 0.5 and 1.5, while having removal rate selectivity between the interconnect film and a tungsten containing film more than 10, or more preferably more than 50 or most preferably more than 100

(4) Polish interconnect metal and silicon oxide or silicon nitride dielectric with removal rate selectivity the blanket interconnect film and the blanket dielectric film is between 0.1 to 5, or preferably between 0.25 and 2 or most preferably between 0.5 and 1.5, while having removal rate selectivity between the interconnect film and a film comprising amorphous Si or poly-Si more than 10, or more preferably more than 50 or most preferably more than 100

(5) Polish interconnect metal and silicon oxide or silicon nitride dielectric with removal rate selectivity the blanket interconnect film and the blanket dielectric film is between 0.1 to 5, or preferably between 0.25 and 2 or most preferably between 0.5 and 1.5, while having removal rate selectivity between the dielectric film and a barrier or liner film such as Ta, TaN, Ru, Co, Ti, TiN, self-forming barrier layer materials is 0.1 to 5, or preferably between 0.25 and 2 or most preferably between 0.5 and 1.5

(6) Polish interconnect metal, and a barrier or liner film such as Ta, TaN, Ru, Co, Ti, TiN, self-forming barrier layer materials silicon oxide dielectric with removal rate selectivity the blanket interconnect film and the blanket barrier/liner film is between 0.1 to 5, or preferably between 0.25 and 2 or most preferably between 0.5 and 1.5, while having removal rate selectivity between the barrier/liner film and a polish stop film such as silicon nitride or silicon carbide or their derivatives is more than 10 or more preferably more than 50 or most preferably more than 100.

The chemical mechanical planarization ("CMP") compositions, methods, and systems disclosed in present invention should provide higher removal rates on metal layer polishing and oxide polishing, such as Co and silicon oxide ($SiO_2$); suitable removal rates on SiN layer polishing (especially on soft polishing pad) with suitable film removal selectivity, low dishing and low defects.

The barrier CMP polishing compositions comprise abrasive, such as composite particles (such as ceria-coated colloidal silica particles) or a combinations of composite particles with colloidal particles (such as colloidal silica particles); a chemical chelator or chelating agent to react with cobalt ion or cobalt oxide to tune (enhance or suppress) cobalt(Co) barrier layer/film removal rate; a pH adjusting agent that is used to adjust pH of the CMP composition to the optimized pH condition, such as alkaline pH condition; a corrosion inhibitor to provide Co barrier layer surface corrosion protection; a surfactant to enhance the wetting of various film surfaces, and the remaining being water.

The abrasives include, but are not limited to composite particles, and combinations of composite particles with silica, alumina, zirconia, titania, ceria, surface modified inorganic oxide particles, or combinations thereof.

For composite particles, each of the composite particles has a core particle and many nanoparticles covering the surface of the core particle. The core particles are selected from the group consisting of silica, alumina, titania, zirconia, and polymer particle. The nanoparticles are selected from the group consisting of zirconium, titanium, iron, manganese, zinc, cerium, yttrium, calcium, magnesium, lanthanum and strontium nanoparticles.

The amount of nanoparticles covering the surface of the core particles preferably falls within the following range in terms of the solid weight ratio. The solid weight (b) of the nanoparticles relative to the solid weight (a) of the core particles is (b)/(a)=0.01 to 1.5, preferably 0.01 to 1.2.

One of the examples of the composite particles is to have silica as the core particles, and the surface of each silica particle is covered by ceria nanoparticles. The silica base particles are amorphous; and the ceria nanoparticles are single crystalline.

Weight ratio of total cerium to silicon in the particles may preferably between 0.05 and 10, or more preferably between 0.1 and 5 or most preferably between 0.5 and 2.

The size of the core silica particles may be between 25 nm to 500 nm, or more preferably between 50 nm and 150 nm. The size of ceria nanoparticles covering the core silica particles may be between 1 nm and 30 nm, or more preferably between 5 nm and 20 nm and most preferably between 8 and 15 nm.

Ceria coated silica particles may be manufactured in many different ways. Some of the preferred examples of ceria coated silica particles are described in JP20131191131, JP2013133255, JP2015-169967, and JP2015-183942.

Another aspect of the present invention, involves use of ceria coated silica particles that do not disintegrate under polishing forces. It is hypothesized that if the particles do not breakdown under the action of polishing forces (i.e. disintegrative forces) and keep the characteristic of original particle size, then the removal rate would remain high. If the particles on the other hand disintegrate under polishing forces, the removal rate would decrease owing to effectively smaller abrasive particle size. Breaking of the particles may also yield irregular shaped particles which may have undesirable effect on scratching defects. Particle stability under disintegrative forces can also be determined by subjecting the composition to the ultra sonication treatment for half an hour and measuring the changes in size distribution. Preferred conditions for ultrasonication treatment are ½ hour immersion in bath with 42 KHZ frequency at 100 W output. Particle size distribution can be measured by using any suitable technique such as Disc Centrifuge (DC) method or Dynamic Light Scattering (DLS). Changes in size distribution can be characterized in terms of changes in mean particle size or D50 (50% particles below this size) or D99 (99% particles below this size) or any similar parameters. Preferably the changes in particle size distribution of ceria coated silica particles after ultrasonication treatment is less than 10%, more preferably less than 5% or most preferably less than 2%; by using for example DC and mean particle size, D50, D75 and/or D99. Using such stable particles in CMP slurry compositions would allow more effective utilization of polishing forces for film material removal and would also prevent generation of any irregular shapes that would contribute to scratching defects. High mechanical integrity of the composite particles would also prevent loss of ceria nanoparticles from the core of the silica particles which are critical for providing high removal rates.

In another aspect of the present invention, the silica-based composite particle having an amorphous oxide layer C including at least one type of element among aluminum, zirconium, titanium, iron, manganese, zinc, cerium, yttrium, calcium, magnesium, lanthanum and strontium on the surface of an amorphous silica particle A, and a crystalline oxide layer B including at least one type of element selected from among zirconium, titanium, iron, manganese, zinc, cerium, yttrium, calcium, magnesium, lanthanum and strontium thereupon.

The abrasives are present in the composition in an amount from 0.01 wt % to 20 wt %, preferably, from 0.05 wt % to 5 wt %, more preferably, from about 0.1 wt % to about 1 wt %.

Use of ceria coated silica particles in the composition compositions allow very high removal rates at relatively low abrasive particle concentrations for certain film types such as cobalt, various types of silicon oxide, silicon nitride and silicon carbide films, while providing ability to have very low removal rates on certain types of films such as tungsten, carbon containing low-K films (both organ silicate glass and polymeric films), poly-Si and amorphous-Si (a-Si).

In certain embodiments where a high removal rates of metallic barrier films such as TiN, Ta, TaN, Ru is desired, compositions may also additionally comprise other known abrasive particles including but are not limited to silica, alumina, zirconia, titania, ceria, surface modified inorganic oxide particles, and other abrasive particles known in the art. The total weight % of the composite particles and the abrasive particles is 0.01 wt % to 20 wt %.

The abrasive particles may be purified using suitable method such as ion exchange to remove metal impurities that may help improve the colloidal stability. Alternatively high purity silica abrasive particles that are manufactured from precursors other than metal silicates can be used.

In general, the above-mentioned abrasive particles may be used either alone or in combination with one another. Two or more abrasive particles with different sizes may also be combined to obtain excellent performance.

The preferred abrasive particles are colloidal silica abrasive particles. A combination of ceria coated silica particles and silica abrasive particles would yield a combination of high removal rates of silicon oxide/nitride films and metallic barrier films. The silica can be any of precipitated silica, fumed silica, silica fumed, pyrogenic silica, silica doped with one or more adjutants, or any other silica-based compound. In an alternate embodiment the silica can be produced, for example, by a process selected from the group consisting of a sol-gel process, a hydrothermal process, a plasma process, a fuming process, a precipitation process, and any combination thereof.

The silica in one embodiment is advantageously at a particle size between about 2 and about 300 nanometers, for example between about 30 and about 250 nanometers or most preferably between 50 and 100 nanometers.

Colloidal silica particles used may be spherical or cocoon shaped.

The suitable chelating agent includes, but is not limited to organic acids and their salts; polymeric acids and their salts; water soluble copolymers and their salts; copolymers and their salts containing at least two different types of acid groups selected from carboxylic acid groups; sulfonic acid groups; phosphoric acids; and pyridine acids in the same molecule of a copolymer; polyvinyl acids and their salts, inorganic potassium silicate and ammonium silicate; polyethylene oxide; polypropylene oxide; pyridine, pyridine derivatives, bipyridine, bipyridine derivatives, and combinations thereof.

The organic acids include but are not limited to amino acids; carboxylic acids; phosphoric acids; sulfonic acids; polyvinyl acids; and pyridine acids; bipyridine acids.

The polymeric acids and their salts include but are not limited to polymeric compounds that having a functional group selected from the group consisting of carboxylic acids and their salts thereof; sulfonic acids and their salts thereof; phosphonic acids and their salts thereof; pyridine acids and their salts thereof. Examples are polymeric carboxylic acids and their salts thereof; polymeric sulfonic acids and their salts thereof; polymeric phosphonic acids and their salts thereof; polymeric pyridine acids and their salts thereof. More specific examples are polyacrylic acids and their salts; polystyrene sulfonic acids and their salts; bipyridine acids and their salts.

The amount of chelating agent ranges from about 0.001 wt % to about 5 wt % relative to the total weight of the barrier CMP composition. The preferred range is from about 0.01% to about 2.0 wt %, and more preferred range is from about 0.1 wt % to about 1.0 wt %, The pH-adjusting agent includes, but is not limited to hydroxides, amines, organic acids and inorganic acids.

The suitable hydroxide includes but is not limited to sodium hydroxide, potassium hydroxide, ammonium hydroxide, quaternary organic ammonium hydroxide (e.g. tetramethylammonium hydroxide) and mixtures thereof.

The suitable inorganic acid includes but is not limited to nitric acid, sulfonic acid, phosphoric acid, hydrogen chloride, and mixtures thereof.

The amount of pH-adjusting agent ranges from about 0.0001 wt % to about 5 wt % relative to the total weight of the CMP composition. The preferred range is from about 0.0005% to about 1 wt %, and more preferred range is from about 0.0005 wt % to about 0.5 wt %, and most preferred range is from about 0.001 wt % to about 0.1 wt %, The pH of the CMP composition ranges from about 2 to about 12. The optimal pH of the slurry composition depend on specific performance requirements for the particular application. For certain embodiments requiring polishing of cobalt films, a higher pH (>8) may be desirable for lowering cobalt corrosion during polishing. In some other embodiments requiring the ability to suppress removal rates of films such as a-Si, poly-Si films, silicon nitride, silicon carbide, while still requiring high removal rates of silicon oxide films, a pH<8 would be desired.

For example, the polishing compositions having a pH of 5.0-8.0 offer removal rate selectivity of 1.0:4.0 to 4.0:1.0 for $SiO_2$:Co; and 10:1 to 15:1.0 for Co:SiN.

The polishing compositions having a pH of 8.0-11 offer removal rate selectivity of 1.0:4.0 to 4.0:1.0 for $SiO_2$:Co; and 1.0:1.0 to 6.0:1.0 for Co:SiN; and have stop on polishing W.

The polishing compositions having a pH of 5.0-9.0 offer removal rate selectivity of 1.0:4.0 to 4.0:1.0 for $SiO_2$:Co; and 10:1 to 15:1.0 for Co:SiN; and have stop on polishing a-Si, OSG, SiOC, and W.

The suitable corrosion inhibitor includes, but is not limited to benzotriazole (BTA), imidazole, triazole, and their relative derivatives, pyrazole and its derivatives, benzoimidazole and its derivatives, tetrazole and its derivatives and combinations thereof.

The amount of corrosion inhibitor ranges from about 0.0005 wt % to about 0.5 wt % relative to the total weight of the barrier CMP composition. The preferred range is from about 0.0025% to about 0.15 wt %, and more preferred range is from about 0.01 wt % to about 0.1 wt %, The CMP composition of the present invention may comprise 0.0001 wt % to 10 wt % of one or more of various surfactants.

While there are many suitable surfactant additives for the composition, preferred surfactant additives include dodecyl sulfate sodium salt, sodium lauryl sulfate, dodecyl sulfate ammonium salt, alcohol ethoxylates, acetylenic surfactant, and any combination thereof. Suitable commercially available surfactants include TRITON DF 16™ manufactured by Dow Chemicals and various surfactants in SUIRFYNOL™, DYNOL™ Zetasperse™, Nonidet™, and Tomadol™ surfactant families, manufactured by Air Products and Chemicals.

Various anionic, cationic, nonionic and zwitterionic surfactants having molecular weight in the range from less than 1000 to greater than 30,000 are contemplated as surfactants. Included are sodium, potassium, or preferably ammonia salts of stearate, lauryl sulfate, alkyl polyphosphate, dodecyl benzene sulfonate, disopropylnaphthalene sulfonate, dioctylsulfosuccinate, ethoxylated and sulfated lauryl alcohol, and ethoxylated and sulfated alkyl phenol.

Various cationic surfactants include polyethyleneimine, ethoxylated fatty amine and stearylbenzyldimethylammonium chloride or nitrate. Alternate surfactants contemplated in the present invention include: polyethylene glycols, lecithin, polyvinyl pyrrolidone, polyoxyethylene, isoctylphenyl ether, polyoxyethylene nonylphenyl ether, amine salts of alkylaryl sulfonates, polyacrylate and related salts, polymethacrylate.

If a surfactant is added to the first CMP composition, then it may be an anionic, cationic, nonionic, or amphoteric surfactant or a combination of two or more surfactants can be employed. Furthermore, it has been found that the addition of a surfactant may be useful to reduce the within-wafer-non-uniformity (WIWNU) of the wafers, thereby improving the surface of the wafer and reducing wafer defects.

In general, the amount of additive such as a surfactant that may be used in the first CMP composition should be sufficient to achieve effective stabilization of the composition and will typically vary depending on the particular surfactant selected and the nature of the surface of the metal oxide abrasive. For example, if not enough of a selected surfactant is used, it will have little or no effect on first CMP composition stabilization. On the other hand, too much surfactant in the CMP composition may result in undesirable foaming and/or flocculation in the composition. As a result, stabilizers such as surfactants should generally be present in the composition of this invention in an amount ranging from about 0.001% to about 0.2% by weight, and preferably from about 0.001 to about 0.1 weight percent. Furthermore, the additive may be added directly to the composition or treated onto the surface of the metal oxide abrasive utilizing known techniques. In either case, the amount of additive is adjusted to achieve the desired concentration in the first polishing composition.

Preferred surfactants are nonionic surfactants selected from a group comprising of acetylenic diol surfactants, such as Dynol™ 607 from Air Products and Chem. and alcohol ethoxylate surfactants, such as Brij® L23 from Sigma-Aldrich® and Dynol™ 607 from Air Products and Chemicals.

The CMP composition may comprise a dispersing additive to stabilize particle dispersion.

The suitable dispersing additive includes, but is not limited to organic acids and their salts; polymeric acids and their salts; water soluble copolymers and their salts; copolymers and their salts containing at least two different types of acid groups, such as carboxylic acid groups, sulfonic acid groups, or phosphonic acid groups in the same molecule of a copolymer, polyvinyl acid and salt thereof, polyethylene oxide, polypropylene oxide, and combinations thereof.

Examples of polymeric acids Include but are not limited to polyacrylic acid, poly-methacrylic acid, polystyrene sulfonic acid and salts thereof. Number average molecular weight of the polymers may range from 1000 to 1,000,000 or more preferable between 2000 and 100,000 or most preferably between 10,000 and 50,000.

The amount of dispersing additive ranges from about 0.0010 wt % to about 1.0 wt % relative to the total weight of the barrier CMP composition. The preferred range is from about 0.005% to about 0.5 wt %, and more preferred range is from about 0.01 wt % to about 0.25 wt %, The CMP composition of the present invention may also comprise one or more of various oxidizers for promoting the polishing rates of metallic films such as Ti, TiN, Ta, TaN, Co, Cu etc.

Various oxidizing agents such as periodic acid, periodate salts, perbromic acid, perbromate salts, perchloric acid, perchloric salts, perboric acid, and perborate salts and permanganates, as well as bromates, chlorates, chromates, iodates, iodic acid, and cerium(IV) compounds have been reported in literature. Hydrogen peroxide, iodic acid or its salts, and periodic acid or its salts are known to be most commonly used oxidizers in CMP. Hydrogen peroxide is the preferred oxidizer.

Oxidizer addition would likely oxidize Ce(III) on particle surface to Ce(IV) state. As more of the surface is converted from Ce(III) to Ce(IV) by the oxidizer addition, the removal rates of silicon oxide would reduce at excess oxidizer concentrations.

Increase in oxidizer concentration would also generally lead to a decrease in removal rate of cobalt films.

The addition amount of oxidizer addition would depend on desired level of removal rates of metallic films and silicon oxide films. Preferred range of oxidizer concentration to enable high removal rates of both metallic films and silicon oxide films is 0.001 wt % to 5 wt %, or more preferably between 0.005 wt % and 3 wt %. For certain applications, no additional oxidizer addition may be necessary as Ce(III) ions on the particle surface may provide necessary oxidizing reactions.

In certain embodiments, the formulations may also comprise stabilizing compounds to prevent decomposition of hydrogen peroxide by cerium ions on the surface of the particles. Suitable stabilizing agents could be selected from a wide range of organic and inorganic compounds such as but not limited to ascorbic acid, citric acid, ethylenediamine tetraacetic acid, various phosphate compounds, colloidal stannate, etc. The stabilizer compounds may be present in the concentration range of 0.00001 wt % to 0.5 wt %, or more preferably between 0.0001 wt % and 0.1 wt %.

The CMP composition may comprise biological growth inhibitors or preservatives to prevent bacterial and fungal growth during storage when CMP composition has a pH range of 4.5-10.0.

The biological growth inhibitors include, but are not limited to, tetramethylammonium chloride, tetraethylammonium chloride, tetrapropylammonium chloride, alkylbenzyldimethylammonium chloride, and alkylbenzyldimethylammonium hydroxide, wherein the alkyl chain ranges from 1 to about 20 carbon atoms, sodium chlorite, and sodium hypochlorite.

In certain embodiments the compositions can be made in more concentrated form and diluted at point of use with water to reduce costs with shipping and handling. Oxidizer such as hydrogen peroxide may also be added at the point of use.

Some of the commercially available preservatives include KATHON™ and NEOLENE™ product families from Dow Chemicals, and Preventol™ family from Lanxess. More are disclosed in U.S. Pat. No. 5,230,833 (Romberger et al.) and US Patent Application No. US 20020025762. The contents of which are hereby incorporated by reference as if set forth in their entireties.

Formulations of this invention are especially effective on soft pads allowing high silicon oxide rates and low defectivity. CMP pads can be characterized for elasticity or hardness using a variety of techniques such as Shore hardness testing, dynamical mechanical analysis, ultrasonic characterization, compositional analysis to determine ratio of hard to soft polymer segments, etc. Shore D hardness testing measured as per the method described in ASTM D2240-1 0 ASTM standard is a well-known testing method for CMP pad hardness. Although there is no clear definition in literature demarking soft pad and hard pad, CMP pads such as 101000 and 101010 (Supplied by Dow Chemicals) which are generally considered hard pads have a Shore D hardness of 57. CMP pads characterized as soft such as Dow Ikonic 2000 series have Shore D hardness less than 45. Other examples of commercially available soft pads include Politex series pads from Dow Chemicals, EPIC D200 series pad from Cabot Microelectronics, Fujibo H7000N pads from Fujibo, Nexplanar 11EG from Nexplanar, VP3500 pad from Dow Chemicals.

While polishing on soft pads, the formulations of this invention comprising ceria coated silica particles provide at least 2 times, on TEOS films compared to similar formulation comprising other type of particles with comparable mean particle size and abrasive particle loading.

The removal selectivity of material 1 vs material 2 (material 1:material 2) is defined as the ratio of the removal rate of material 1 relative to the removal rate of material 2:

$$\frac{\text{removal rate of material 1}}{\text{removal rate of material 2}}$$

The compositions of present invention provide the removal selectivity of Co:SiN ranges from 4.0 to 1.0, preferably, from 2.5 to 1.0, more preferably, from 1.5 to 1.0; the removal selectivity of Co:SiO$_2$ ranges from 3.0 to 0.5, preferably, from 2.0 to 0.7, more preferably, from 1.1 to 0.9; and, the removal selectivity of SiO$_2$:SiN ranges from 4.0 to 1.0, preferably, from 2.5 to 1.0, more preferably, from 1.5 to 1.0.

General Experimental Procedure

Polishing Pad: Fujibo H7000HN pad or Fujibo H800 pad, supplied by Narubeni America Corporation, was used for CMP process. Co (PVD) barrier layer was deposited by PVD process. SiN film was deposited by PECVD deposition process. TEOS oxide film was deposited by Chemical Vapor Deposition (CVD) using tetraethyl orthosilicate as the precursor.

Parameters:
Å: angstrom(s)—a unit of length
BP: back pressure, in psi units
CMP: chemical mechanical planarization=chemical mechanical polishing
CS: carrier speed
DF: Down force: pressure applied during CMP, units psi
min: minute(s)
ml: milliliter(s)
mV: millivolt(s)
psi: pounds per square inch
PS: platen rotational speed of polishing tool, in rpm (revolution(s) per minute)
SF: polishing composition flow, ml/min
Removal Rates and Removal selectivity
Removal Rate (RR)=(film thickness before polishing–film thickness after polishing)/polish time.
PVD Co RR: Measured PVD Co removal rate at 1.5 psi (with soft Fujibo pad) down pressure of the CMP tool
SiN RR: Measured SiN removal rate at 1.5 psi (with soft Fujibo pad) down pressure of the CMP tool
TEOS RR: Measured TEOS removal rate at 1.5 psi (with soft Fujibo pad) down pressure of the CMP tool
Removal selectivity of TEOS/Co/SiN=TEOS RR/Co RR/SiN RR; at same down force (psi)
All percentages are weight percentages unless otherwise indicated.

In the examples presented below, CMP experiments were run using the procedures and experimental conditions given below.

The CMP tool that was used in the examples is a 200 mm Mirra®, or a 300 mm LK polisher both manufactured by Applied Materials, 3050 Boweres Avenue, Santa Clara, Calif., 95054. A Fujibo H7000HN pad or H800 pad (both are considered as soft pads), supplied by Narubeni America Corporation, was used on the platen for the blanket wafer polishing studies. Pads were broken-in by polishing twenty-five dummy oxide (deposited by plasma enhanced CVD from a TEOS precursor, PETEOS) wafers. In order to qualify the tool settings and the pad break-in, two PETEOS monitors were polished with Syton® OX-K colloidal silica, supplied by Air Products Chemical Incorporation, at baseline conditions. Polishing experiments were conducted using electroplating deposited copper, low-k dielectric layer materials (Organo Silicate Glass, such as Black Diamond®/BD1 and BD2x), TEOS and tantalum nitride wafers. These blanket wafers were purchased from Silicon Valley Microelectronics, 1150 Campbell Ave, CA, 95126, and Advantiv Corporation.

In the following CMP compositions, the ceria coated silica particles were composite particles that having silica as the core particle and ceria nanoparticles on the silica particle surface. Mean particle size of the ceria coated silica particle as measured by Disc Centrifuge method (DC24000 UHR from CPS Instruments) was 96 nm. The ceria coated silica particles were made by methods described in JP20131191131, JP2013133255, JP2016-084243A, JP2015-169967, and JP2015-183942.

WORKING EXAMPLES

Example 1

Co barrier CMP polishing compositions were prepared with 0.1 to 0.75 wt % ceria coated colloidal silica particles as abrasives; 0.1 wt % to about 1.0 wt % potassium silicate or ammonium silicate as the chelating agent to tune cobalt and oxide removal rates; 0.01% to 0.25 wt % of BTA, imidazole, triazole, or their relative derivatives as the corrosion inhibitor for the corrosion inhibition of Co film surface; 0.001 to 0.25 wt % of polyacrylic acid and its salt, ammonium polyacrylate, potassium polyacrylate, polystyrene sulfonic acid or its salt, as the dispersing agent to stabilize particle dispersion and also as the additive to tune the SiN film removal rates; 0.001% to 0.1 wt % nitric acid or potassium hydroxide as pH adjusting agent.

The specific compositions in the working examples comprised the following components: ceria coated colloidal silica as abrasives; Brij® L23 (Sigma-Aldrich®) (ethoxylate type surfactant), potassium silicate, ammonium polyacrylate, and imidazole. The remaining was water. Potassium hydroxide and nitric acid were used as pH adjusting agent. The compositions listed in Table 1 had pH value at pH 9.0

The compositions were listed in Table 1. For example, composition 3 comprised 0.25% ceria coated colloidal silica as abrasives, 0.01% Brij L23 as surface wetting agent, 0.25% potassium silicate as a chelating agent, 0.1% ammonium polyacrylate as dispersing agent, and 0.1% imidazole as corrosion inhibitor.

TABLE 1

CMP Compositions 1, 2 and 3

|  | Composition 1 (wt %) | Composition 2 (wt %) | Composition 3 (wt %) |
|---|---|---|---|
| Ceria coated silica abrasive | 0.25 | 0.25 | 0.25 |
| Brij ® L23 | 0 | 0 | 0.01 |
| potassium silicate | 0.5 | 0.5 | 0.25 |
| ammonium polyacrylate (MW: 16,000-18,000) | 0.1 | 0.1 | 0.1 |
| imidazole | 0 | 0.05 | 0.1 |
| 1H-benzotriazole | 0.05 | 0 | 0 |
| Water | Balance | Balance | Balance |

The removal rates of TEOS, Co, and SiN films were listed in Table 2.

As shown in Table 2, the Co barrier compositions that used ceria coated colloidal silica particles gave similar TEOS and Co removal rates, but relative low SiN removal rates.

TABLE 2

Removal Rates (Å/min.) of TEOS, Co and SiN

|  | TEOS | Co | SiN |
|---|---|---|---|
| Composition 1 | 527 | 664 | 319 |
| Composition 2 | 552 | 462 | 362 |
| Composition 3 | 405 | 407 | 250 |

The removal selectivity of TEOS:Co, and SiN films for the 3 compositions were calculated from the data in Table 1. The results were listed in Table 3.

As shown in Table 3, compositions gave around 1:1 TEOS:Co removal selectivity, and lower than 2.5:1 TEOS:SiN removal selectivity and Co:SiN removal selectivity.

TABLE 3

TEOS:Co:SiN Removal selectivity

|  | TEOS:Co:SiN Removal selectivity |
|---|---|
| Composition 1 | 1.6:2.1:1.0 |
| Composition 2 | 1.5:1.3:1.0 |
| Composition 3 | 1.6:1.6:1.0 |

Those removal selectivity ranges have shown the ability of enabling the CMP Co barrier compositions to achieve the film height corrections and realizing global uniform planarization across the whole patterned wafer surfaces.

SER were measured using these Co barrier CMP polishing compositions on PVD Co chips. The results have shown that the compositions offered very low (<2.0 Å/min.) static etch rates (SER) on Co film surface.

Example 2

In following examples 4, 5 and 6, three different corrosion inhibitors, imidazole, 1,2,4-triazole, and 3-amino-1,2,4-triazole, were used. All other chemical constituents were kept the same. All three samples had pH at 9.0.

The compositions of examples 4, 5 and 6 were listed in Table 4.

TABLE 4

CMP Compositions 4, 5 and 6

|  | Composition 4 (wt %) | Composition 5 (wt %) | Composition 6 (wt %) |
|---|---|---|---|
| Ceria coated silica abrasive | 0.125 | 0.125 | 0.125 |
| Brij ® L23 | 0.01 | 0.01 | 0.01 |
| potassium silicate | 0.25 | 0.25 | 0.25 |
| ammonium polyacrylate (Molecular weight: 16000-18000) | 0.1 | 0.1 | 0.1 |
| imidazole | 0.05 |  |  |
| 1,2,4-triazole |  | 0.1 |  |
| 3-amino-1,2,4-triazole |  |  | 0.1 |
| Water | Balance | Balance | Balance |

The removal rates of TEOS, Co, SiN and W films were listed in Table 5.

TABLE 5

Removal Rates (Å/min.) of TEOS, Co, SiN and W

|  | TEOS | Co | SiN | W |
| --- | --- | --- | --- | --- |
| Composition 4 | 791 | 431 | 319 | 1 |
| Composition 5 | 778 | 381 | 317 | 1 |
| Composition 6 | 789 | 376 | 315 | 1 |

As the results showing in Table 5, similar TEOS and SiN removal rates were obtained for all three different corrosion inhibitors used in 3 different compositions. The relative lower Co removal rates obtained for Composition 5 and 6 due to the increased corrosion inhibitor concentrations to 0.1% while comparing the corrosion inhibitor used in composition 4 was at 0.05%.

Importantly, all three polishing compositions showed fully stop on polishing W films.

The selectivity of TEOS:Co:SiN were listed in Table 6. The results indicated that all three films, TEOS, Co and SiN, have very high selectivity vs W film being polished.

TABLE 6

TEOS:Co:SiN Removal selectivity

| Samples | TEOS:Co:SiN Removal selectivity |
| --- | --- |
| Composition 4 | 2.48:1.35:1.0 |
| Composition 5 | 2.45:1.20:1.0 |
| Composition 6 | 2.50:1.19:1.0 |

The polishing compositions comprising the composite particles as abrasives in the present invention have shown the ability of stopping on W films but still providing high TEOS and Co removal rates. The polishing compositions have shown the usefulness in some advanced Co barrier CMP polishing applications, wherein the ability to stop on W films is required while still maintaining high TEOS and Co removal rates.

Example 3

Composition 7 was prepared according to Table 7. The composition had pH=7.0

TABLE 7

CMP Composition 7

|  | Composition 7 (wt %) |
| --- | --- |
| Ceria coated silica abrasive | 0.1 |
| Brij ® L23 | 0.01 |
| BTA | 0.01 |
| Ammonium Polyacrylate (Molecular weight: 16000-18000) | 0.1 |
| imidazole | 0.1 |
| Water | Balance |

The polishing removal rates on different films using composition 7 were listed in Table 8.

As shown in Table 8, high TEOS and Co removal rates were obtained. Importantly, excellent stop properties for polishing a-Si, SiOC film, and BD2X were observed as well.

TABLE 8

Removal Rates (Å/min.) of various films

| TEOS | Co | SiN | a-Si | Silicon Oxy Carbide (SiOC) | BD2X |
| --- | --- | --- | --- | --- | --- |
| 439 | 371 | 33 | 4 | 4 | 0 |

The selectivity of TEOS:Co:Si:a-Si:LK film were listed in Table 9.

TABLE 9

TEOS:Co:SiN;a-Si:LK Film Removal selectivity

| Samples | TEOS:Co:SiN:a-Si:LK Film Removal selectivity |
| --- | --- |
| Composition 7 | 100:93:8:1.0:1.0 |

High selectivity of TEOS:a-Si, Co:a-Si, TEOS:LK, Co:LK, TEOS:BD2X, and Co:BD2X were achieved using the polishing compositions.

Comparing the data obtained in Example 2, the SiN removal rate was suppressed by using lower pH of the composition in Example 3. The results have shown that the compositions with pH of 7.5 or lower might allow high removal rate selectivity between films such as silicon oxide or interconnect metals or barrier/liner films and silicon nitride films. The compositions have shown the usefulness for certain Co polishing applications that not only requires to stop on W film, but also need to stop on amorphous silicon (a-Si) and silicon-oxy carbide (SiOC) film (with estimated dielectric constant>4) films.

Example 4

The examples of the cobalt polishing compositions either using ceria coated silica (Composition 9) as abrasives or using colloidal silica abrasives (comparative Composition 8) were listed in table 10. Colloidal silica (PL-3) was obtained from Fuso Corporation, Japan. Particle size of PL-3 colloidal silica as measured by dynamic light scattering analysis was 70 nm.

The polishing results using the composition 8 and composition 9 were listed in table 11 respectively.

TABLE 10

CMP Compositions 8 and 9

|  | Composition 8 (wt %) | Composition 9 (wt %) |
| --- | --- | --- |
| KOH | 0.5500 |  |
| BTA | 0.0105 | 0.05 |
| Benzene Sulfonic Acid | 0.5500 |  |
| Dynol 607 | 0.00775 |  |
| Ammonium Polyacrylate (Molecular weight: 16000-18000) |  | 0.1 |
| Fuso PL-3 Colloidal silica | 3.1035 |  |
| Brij L23 |  | 0.01 |
| Potassium Silicate |  | 0.25 |
| Ceria coated silica |  | 0.15 |
| Imidazole |  | 0.05 |
| Water | Balance | Balance |
| pH | 11.1 | 10 |

TABLE 11

Removal Rates (Å/min.) of TEOS, Co, SiN, W

|  | TEOS | Co | SiN | W |
|---|---|---|---|---|
| Composition 8 | 557 | 168 | 147 | 57 |
| Composition 9 | 1195 | 468 | 452 | 2 |

Polishing performance comparison could be drawn from Table 11 between the composition comprising ceria coated silica particles (composition 9) and the comparative composition comprising colloidal silica (composition 8).

With the use of ceria coated colloidal silica as abrasives (composition 9), the desirable Co barrier CMP polishing performance to stop on W film (W film removal rate was 2 Å/min.) was achieved. But using colloidal silica abrasive based cobalt barrier polishing compositions (composition 8), tungsten removal rates were more than 25 times higher (>50 Å/min.) even without using hydrogen peroxide as oxidizing agent. Such high removal rates prevented the ability to stop at tungsten layer during polishing of patterned wafers.

In addition, colloidal silica composition 8 also provided significantly lower cobalt removal rates compared to composition 9 which even had much lower abrasive concentrations. Composition 9 also provided much higher oxide removal rates than example 8.

The selectivity of TEOS:Co:SiN:W for examples of 8 and 9 were listed in Table 12.

TABLE 12

TEOS:Co:SiN:W Film Removal selectivity

|  | TEOS:Co:SiN:W Removal selectivity |
|---|---|
| Composition 8 | 9.8:2.9:2.6:1.0 |
| Composition 9 | 598:234:226:1.0 |

As the TEOS:Co:SiN:W removal selectivity data showed in table 12, with the use of ceria coated silica as abrasives in polishing composition 9, very higher selectivity were achieved than the selectivity obtained with the colloidal silica as abrasives in polishing composition 8.

High removal rates and removal selectivity could only be achieved with the compositions of present invention.

Example 5

Table 13 listed the compositions comprising ceria coated silica particles only (composition 10), colloidal silica particles only (composition 11), and both ceria coated silica particles and colloidal silica particles, that is, a combination of ceria coated silica particles with colloidal silica particles (composition 12).

Figure 1:
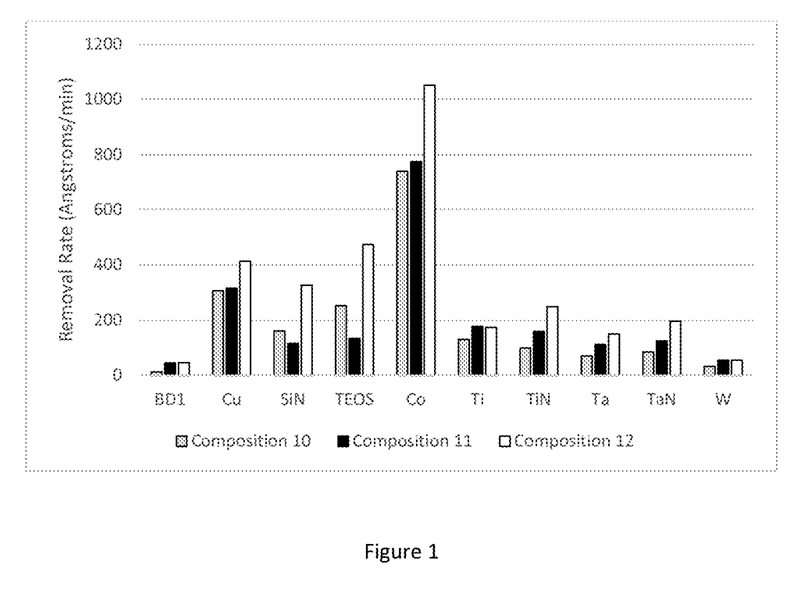
FIG. 1 shows removal rates for different films with CMP compositions with different abrasives.

FIG. 1 displayed the removal rate data on various films with these compositions. FIG. 1 has shown that for many film types such as Cu, SiN, TEOS, Co, TiN, Ta and TaN, significant boost in removal rates have been obtained by mixing the two different types of abrasives. At the same time, for certain film types such as BD1 and W where low removal rates are desired, a combination of ceria coated silica particles and colloidal silica particles, did not increase the removal rates compared to compositions containing colloidal silica by itself.

TABLE 13

CMP compositions 10-12

|  | Composition 10 (wt %) | Composition 11 (wt %) | Composition 12 (Wt %) |
|---|---|---|---|
| Ceria coated silica | 0.25 | — | 0.25 |
| Fuso PL3 Colloidal Silica | — | 2 | 2 |
| Brij L23 | 0.01 | 0.01 | 0.01 |
| 1,2,4-triazole | 0.5 | 0.5 | 0.5 |
| Potassium Silicate | 0.5 | 0.5 | 0.5 |
| Hydrogen Peroxide | 0.01 | 0.01 | 0.01 |
| Water | Balance | Balance | Balance |
| pH | 10 | 10 | 10 |

The compositions using a combination of ceria coated silica particles and colloidal silica particles resulted in unexpected synergistic increase in removal rates of various films.

Example 6

Four compositions 12, 13, 14, and 15 were prepared. Compositions 13, 14, and 15 were prepared based on Composition 12 showing in Table 13 by only changing the concentrations of hydrogen peroxide from 0.01 wt % (Composition 12) to 0.1 wt % (Composition 13), 0.25 wt % (Composition 14), and 0.5 wt % (Composition 15), respectively. All four samples had pH of 10 prior to hydrogen peroxide addition.

Figure 2:
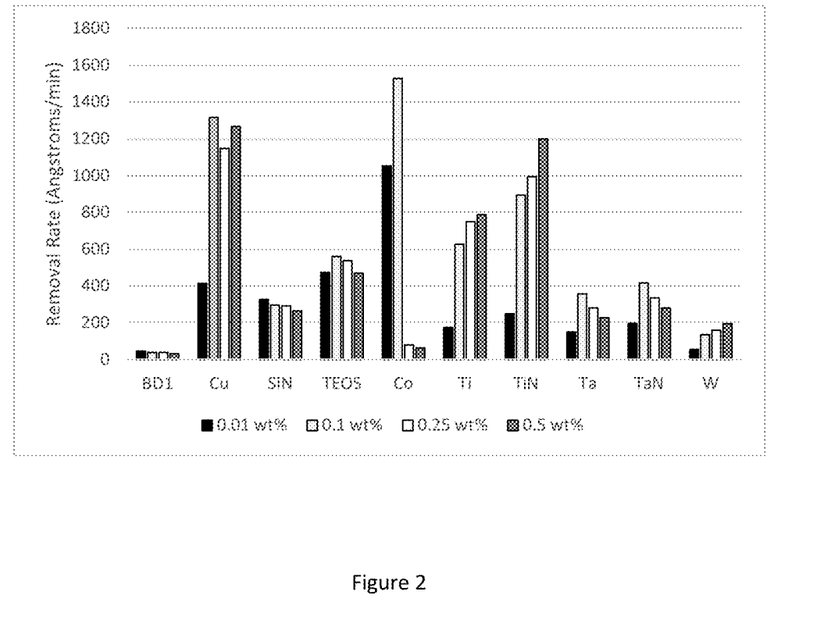
FIG. 2 shows the removal rates for different films with CMP compositions at different hydrogen peroxide concentrations.

The removal rates of various films were shown in FIG. 2.

As shown in FIG. 2, removal rates of certain metal films such as Ti, TiN, Ta and TaN could be increased while maintaining high removal rates for TEOS and SiN dielectric films, by adjusting the hydrogen peroxide in the composition 12. By increasing hydrogen peroxide concentration, cobalt surface is passivated resulting in lower polish rates.

The foregoing examples and description of the embodiments should be taken as illustrating, rather than as limiting the present invention as defined by the claims. As will be readily appreciated, numerous variations and combinations of the features set forth above can be utilized without departing from the present invention as set forth in the claims. Such variations are intended to be included within the scope of the following claims.

The invention claimed is:

1. A polishing composition comprising:
   0.01 wt % to 20 wt % of ceria coated silica composite particles and silica abrasive particles and;
   0.0001 wt % to 5 wt % of a pH-adjusting agent selected from the group consisting of sodium hydroxide, potassium hydroxide, ammonium hydroxide, quaternary organic ammonium hydroxide, nitric acid, sulfonic acid, phosphoric acid, hydrogen chloride, and mixtures thereof;
   0.0005 wt % to 0.5 wt % of a corrosion inhibitor selected form the group consisting of benzotriazole, imidazole, triazole and combinations thereof;
   a surfactant selected from the group consisting of acetylenic diol surfactant, alcohol ethoxylate surfactant and combination thereof;
   potassium silicate; ammonium silicate; and
   water;
   wherein
   the polishing composition has a pH of from about 2 to 11.

2. The polishing composition of claim 1 further comprises at least one of
(1) 0.0010 wt % to about 1.0 wt % of dispersing additive selected form the group consisting of organic acid or its salt; polymeric acid or its salt; water soluble copolymer or its salt; copolymer or its salt containing at least two acid groups selected from the group consisting of carboxylic acid group, sulfonic acid group, and phosphonic acid group in the same molecule of a copolymer; polyvinyl acid or its salt, polyethylene oxide; polypropylene oxide; and combinations thereof;
(2) 0.001 wt % to 5 wt % of an oxidizer selected from the group consisting of hydrogen peroxide, periodic acid, periodate salt, perbromic acid, perbromate salt, perchloric acid, perchloric salt, perboric acid, and perborate salt, permanganate, bromate, chlorate, chromate, iodate, iodic acid, and combinations thereof; and
(3) 0.001 wt % to 5 wt % of a chelating agent selected from the group consisting of organic acid or its salt; polymeric acid or its salt; water soluble copolymer or its salt; copolymer or its salt containing at least two acid groups selected from the group consisting of carboxylic acid group, sulfonic acid group, phosphoric acid, and pyridine acid in the same molecule of a copolymer; polyvinyl acid or its salt; inorganic polyethylene oxide; polypropylene oxide; pyridine or its derivative; bipyridine or its derivative; bipyridine or its derivative; and combinations thereof.

3. The polishing composition of claim 1 further comprises a dispersing additive selected from the group consisting of a polymeric acid or its salt, and combinations thereof; wherein the polymeric acid is selected from the group consisting of polyacrylic acid, poly-methacrylic acid, polystyrene sulfonic acid or its salt, and combinations thereof.

4. The polishing composition of claim 1, wherein the pH-adjusting agent is ammonium hydroxide or potassium hydroxide.

5. The polishing composition of claim 1, wherein the pH-adjusting agent is ammonium hydroxide or potassium hydroxide; and further comprises hydrogen peroxide.

6. A polishing method for chemical mechanical planarization of a semiconductor device comprising at least one surface having a first material selected from the group consisting of metallic or alloy form of Co, Cu, Al, and combinations, and a second material, comprising the steps of:
a) contacting the at least one surface with a polishing pad;
b) delivering a polishing composition to the at least one surface, the polishing composition comprising:
0.01 wt % to 20 wt % of ceria coated silica composite particles and silica abrasive particles and;
0.0001 wt % to 5 wt % of a pH-adjusting agent selected from the group consisting of sodium hydroxide, potassium hydroxide, ammonium hydroxide, quaternary organic ammonium hydroxide, nitric acid, sulfonic acid, phosphoric acid, hydrogen chloride, and mixtures thereof;
0.0005 wt % to 0.5 wt % of a corrosion inhibitor selected form the group consisting of benzotriazole, imidazole, triazole and combinations thereof;
a surfactant selected from the group consisting of acetylenic diol surfactant, alcohol ethoxylate surfactant and combination thereof; potassium silicate; ammonium silicate; and
water;
wherein
the polishing composition has a pH of from about 2 to 11;
and
C) polishing the at least one surface with the polishing composition.

7. The polishing method for of claim 6, wherein polishing composition further comprises at least one of
(1) 0.0010 wt % to about 1.0 wt % of dispersing additive selected form the group consisting of organic acid or its salt; polymeric acid or its salt; water soluble copolymer or its salt; copolymer or its salt containing at least two acid groups selected from the group consisting of carboxylic acid group, sulfonic acid group, and phosphonic acid group in the same molecule of a copolymer; polyvinyl acid or its salt, polyethylene oxide; polypropylene oxide; and combinations thereof;
(2) 0.001 wt % to 5 wt % of an oxidizer selected from the group consisting of hydrogen peroxide, periodic acid, periodate salt, perbromic acid, perbromate salt, perchloric acid, perchloric salt, perboric acid, and perborate salt, permanganate, bromate, chlorate, chromate, iodate, iodic acid, and combinations thereof; and
(3) 0.001 wt % to 5 wt % of a chelating agent selected from the group consisting of organic acid or its salt; polymeric acid or its salt; water soluble copolymer or its salt; copolymer or its salt containing at least two acid groups selected from the group consisting of carboxylic acid group, sulfonic acid group, phosphoric acid, and pyridine acid in the same molecule of a copolymer; polyvinyl acid or its salt; inorganic polyethylene oxide; polypropylene oxide; pyridine or its derivative; bipyridine or its derivative; bipyridine or its derivative; and combinations thereof.

8. The polishing method for of claim 6, wherein the polishing composition further comprises a dispersing additive selected from the group consisting of a polymeric acid or its salt, and combinations thereof; wherein the polymeric acid is selected from the group consisting of polyacrylic acid, poly-methacrylic acid, polystyrene sulfonic acid or its salt, and combinations thereof.

9. The polishing method for of claim 6, wherein the pH-adjusting agent is ammonium hydroxide or potassium hydroxide.

10. The polishing method for of claim 6, wherein the pH-adjusting agent is ammonium hydroxide or potassium hydroxide; and further comprises hydrogen peroxide.

11. The polishing method for of claim 6, wherein
the polishing pad is a soft pad;
the first material is Co;
the second material is selected from the group consisting of Co, SiN, $SiO_2$, W and combinations thereof;
the polishing composition has a pH of 8.0-11;
the polishing composition has removal rate selectivity of 1.0:4.0 to 4.0:1.0 for $SiO_2$:Co; and 1.0:1.0 to 6.0:1.0 for Co:SiN; and
wherein the polishing composition has stop on polishing W.

12. The polishing method for of claim 6, wherein
the polishing pad is a soft pad;
the second material is selected from the group consisting of Co, SiN, $SiO_2$, and combinations thereof;
the polishing composition has a pH of 5.0-8.0; and
the polishing composition has removal rate selectivity of 1.0:4.0 to 4.0:1.0 for $SiO_2$:Co; and 10:1 to 15:1.0 for Co:SiN.

13. The polishing method for of claim 6, wherein
the polishing pad is a soft pad;
the first material is Co;
the second material is selected from the group consisting of Co, SiN, $SiO_2$, a-Si, Organo Silicate Glass (OSG), silicon oxy carbide (SiOC), W, and combinations thereof;
the polishing composition has a pH of 5.0-9.0; and
the polishing composition has removal rate selectivity of 1.0:4.0 to 4.0:1.0 for $SiO_2$:Co; and 10:1 to 15:1.0 for Co:SiN; and
wherein the polishing composition has stop on polishing a-Si, OSG, SiOC, and W.

14. A system for chemical mechanical planarization, comprising:
  a semiconductor device comprising at least one surface having a first material selected from the group consisting of metallic or alloy form of Co, Cu, Al, and combinations, and a second material;
  a polishing pad; and
  a polishing composition comprising:
    0.01 wt % to 20 wt % of ceria coated silica composite particles and silica abrasive particles and;
    0.0001 wt % to 5 wt % of a pH-adjusting agent selected from the group consisting of sodium hydroxide, potassium hydroxide, ammonium hydroxide, quaternary organic ammonium hydroxide, nitric acid, sulfonic acid, phosphoric acid, hydrogen chloride, and mixtures thereof;
    0.0005 wt % to 0.5 wt % of a corrosion inhibitor selected form the group consisting of benzotriazole, imidazole, triazole and combinations thereof;
    a surfactant selected from the group consisting of acetylenic diol surfactant, alcohol ethoxylate surfactant and combination thereof;
    potassium silicate; ammonium silicate; and
    water;
    wherein
    the polishing composition has a pH of from about 2 to 11;
  and
  wherein the at least one surface is in contact with the polishing pad and the polishing composition.

15. The system of claim 14, wherein the polishing composition further comprises at least one of
  (1) 0.0010 wt % to about 1.0 wt % of dispersing additive selected form the group consisting of organic acid or its salt; polymeric acid or its salt; water soluble copolymer or its salt; copolymer or its salt containing at least two acid groups selected from the group consisting of carboxylic acid group, sulfonic acid group, and phosphonic acid group in the same molecule of a copolymer; polyvinyl acid or its salt, polyethylene oxide; polypropylene oxide; and combinations thereof;
  (2) 0.001 wt % to 5 wt % of an oxidizer selected from the group consisting of hydrogen peroxide, periodic acid, periodate salt, perbromic acid, perbromate salt, perchloric acid, perchloric salt, perboric acid, and perborate salt, permanganate, bromate, chlorate, chromate, iodate, iodic acid, and combinations thereof; and
  (3) 0.001 wt % to 5 wt % of a chelating agent selected from the group consisting of organic acid or its salt; polymeric acid or its salt; water soluble copolymer or its salt; copolymer or its salt containing at least two acid groups selected from the group consisting of carboxylic acid group, sulfonic acid group, phosphoric acid, and pyridine acid in the same molecule of a copolymer; polyvinyl acid or its salt; inorganic polyethylene oxide; polypropylene oxide; pyridine or its derivative; bipyridine or its derivative; bipyridine or its derivative; and combinations thereof.

16. The system of claim 15, wherein the polishing composition further comprises (1) a dispersing additive selected from the group consisting of a polymeric acid or its salt, and combinations thereof; wherein the polymeric acid is selected from the group consisting of polyacrylic acid, poly-methacrylic acid, polystyrene sulfonic acid or its salt, and combinations thereof.

17. The system of claim 14, wherein the pH adjusting agent is ammonium hydroxide or potassium hydroxide.

18. The system of claim 14, wherein the pH adjusting agent is ammonium hydroxide or potassium hydroxide; and the polishing composition further comprises hydrogen peroxide.

* * * * *